(12) United States Patent
Chauhan et al.

(10) Patent No.: US 10,348,280 B2
(45) Date of Patent: Jul. 9, 2019

(54) CONTROLLING CURRENT LIMITS IN CURRENT LIMITING CIRCUITS

(71) Applicant: TEXAS INSTRUMENTS INCORPORATED, Dallas, TX (US)

(72) Inventors: Ankur Chauhan, Bangalore (IN); Subrato Roy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/857,135

(22) Filed: Dec. 28, 2017

(65) Prior Publication Data

US 2018/0262184 A1 Sep. 13, 2018

(30) Foreign Application Priority Data

Mar. 9, 2017 (IN) .............................. 201741008256

(51) Int. Cl.

| | |
|---|---|
| *G01R 19/00* | (2006.01) |
| *G01R 1/30* | (2006.01) |
| *H02H 5/04* | (2006.01) |
| *G05F 1/00* | (2006.01) |
| *G05F 3/16* | (2006.01) |
| *G01K 3/10* | (2006.01) |
| *H03K 5/08* | (2006.01) |
| *G05F 1/46* | (2006.01) |
| *G05F 1/573* | (2006.01) |

(52) U.S. Cl.
CPC ............... *H03K 5/086* (2013.01); *G05F 1/46* (2013.01); *G05F 1/573* (2013.01)

(58) Field of Classification Search
CPC .. H03K 5/086; G05F 1/00; G05F 1/10; H02H 5/04; G01K 7/01
USPC .. 327/52, 53, 58, 60, 62, 63, 65–69, 71, 72, 327/74, 77–81, 88, 89, 96, 127, 246, 266, 327/274, 280, 287, 306–333, 359, 327/560–563
See application file for complete search history.

(56) References Cited

U.S. PATENT DOCUMENTS

| | | | | |
|---|---|---|---|---|
| 5,220,207 | A * | 6/1993 | Kovalcik | ................ G05F 1/561 327/362 |
| 6,011,413 | A * | 1/2000 | Hayakawa | ......... G01R 19/0092 327/51 |
| 6,424,131 | B1 * | 7/2002 | Yamamoto | ......... H03K 17/0822 323/282 |
| 7,106,042 | B1 * | 9/2006 | Jackson | .................. G05F 1/575 323/275 |

(Continued)

*Primary Examiner* — Brandon S Cole
(74) *Attorney, Agent, or Firm* — Tuenlap Chan; Charles A. Brill; Frank D. Cimino

(57) ABSTRACT

An example current limiting apparatus comprises a first transistor to carry a first current; a sense transistor coupled to the first transistor, the sense transistor to carry a sense current that is a function of the first current; a first amplifier coupled to the first transistor and the sense transistor, the amplifier to achieve a common voltage potential on terminals of the first and the sense transistors; a second amplifier coupled to the first amplifier and the sense transistor, the second amplifier to control the first and sense transistors based on the sense current; and a circuit coupled to the first and second amplifiers, the circuit to control an input to the second amplifier based on an input to the first amplifier such that a current limit of the first transistor remains below a programmed current limit of the first transistor.

19 Claims, 3 Drawing Sheets

(56) References Cited

U.S. PATENT DOCUMENTS

| | | | | |
|---|---|---|---|---|
| 7,319,314 B1* | 1/2008 | Maheshwari | ............ | G05F 1/46 |
| | | | | 323/313 |
| 7,443,327 B2* | 10/2008 | Chida | ................ | H03M 1/0612 |
| | | | | 341/135 |
| 8,232,781 B2* | 7/2012 | Marino | ............ | G01R 19/16552 |
| | | | | 323/271 |
| 9,195,252 B1* | 11/2015 | Tanase | .................... | G05F 3/262 |
| 9,829,387 B2* | 11/2017 | Furtner | .................... | G01K 7/01 |
| 2006/0197580 A1* | 9/2006 | Barker | ............... | H03K 17/0822 |
| | | | | 327/365 |
| 2012/0293238 A1* | 11/2012 | Chen | ........................ | G01K 3/10 |
| | | | | 327/512 |
| 2016/0262233 A1* | 9/2016 | Ahn | .................. | H05B 33/0845 |

\* cited by examiner

CONTROLLING CURRENT LIMITS IN CURRENT LIMITING CIRCUITS

CROSS-REFERENCE TO RELATED APPLICATIONS

The present application claims priority to Indian Provisional Patent Application No. 201741008256, which was filed Mar. 9, 2017, is titled "A Novel Current Limit Fold-Back Architecture Scalable With Programmed Current Limit," and is hereby incorporated herein by reference in its entirety.

BACKGROUND

Current limiting circuits are often used to limit current in a particular application. Such circuits often receive reference voltages that are used to control voltages output by the current limiting circuits.

SUMMARY

An example current limiting apparatus comprises a first transistor to carry a first current; a sense transistor coupled to the first transistor, the sense transistor to carry a sense current that is a function of the first current; a first amplifier coupled to the first transistor and the sense transistor, the amplifier to achieve a common voltage potential on terminals of the first and the sense transistors; a second amplifier coupled to the first amplifier and the sense transistor, the second amplifier to control the first and sense transistors based on the sense current; and a circuit coupled to the first and second amplifiers, the circuit to control an input to the second amplifier based on an input to the first amplifier such that a current limit of the first transistor remains below a programmed current limit of the first transistor.

An example apparatus comprises a current-limiting circuit to receive an output voltage and a reference voltage. The apparatus comprises a circuit coupled to the current-limiting circuit and configured to control the reference voltage based on the output voltage. The circuit includes a first field effect transistor (FET) having a drain to receive the output voltage and a gate to receive a regulated voltage; a second FET having a gate coupled to a source of the first FET, the second FET further including a source coupled to a first resistor and a drain coupled to a current mirror; a second resistor coupled to the current mirror; and an amplifier coupled to the second resistor and to the current mirror. The first and second resistors define a ratio of the reference voltage to the output voltage.

In some examples, a method comprises providing a first current through a first field effect transistor (FET); providing a sense current through a sense FET coupled to the first FET, the sense current dependent on the first current; driving, by a first amplifier and a third FET, sources of the first and second FETs to a common voltage potential, the first amplifier receiving an output voltage from the first FET; controlling, by a second amplifier, gates of the first and second FETs based on a reference voltage and the sense current; and controlling the reference voltage based on the output voltage such that the first current remains at or below a programmed current limit of the first FET.

BRIEF DESCRIPTION OF THE DRAWINGS

For a detailed description of various examples, reference will now be made to the accompanying drawings in which.

DETAILED DESCRIPTION

Current limiting circuits are used to control or limit current flow in most power path protection applications. For example, it is sometimes desirable to limit the current that may be provided on an output pin of an integrated circuit device in the event that an over current or a short circuit event occurs at that pin. Current limiting circuits often receive reference voltages that are used to control current flow. Based on the difference between the programmed current limit of a current limiting circuit and the output impedance of the circuit, the output voltage of the current limiting circuit will change. In certain current limiting circuit architectures, an excessively low output voltage relative to the reference voltage will cause the ratio between the main and sense transistors to become skewed, resulting in output currents (and current limits) that far exceed the current limit that was programmed into the current limiting circuit. When a current limiting circuit is no longer able to regulate current to be below the programmed limit, it is no longer performing properly.

Disclosed herein are various examples of systems and methods for correcting the error described above when output pin voltages in current limiting circuits drop low relative to the reference voltages. Specifically, the systems and methods described herein control the reference voltage in a current limiting circuit as a function of the output voltage. Thus, for example, as the output voltage falls, the reference voltage is also pulled down as a function of the output voltage. In this way, the output voltage does not drop below the reference voltage such that the current limiting circuit becomes unstable. Thus, the current output of the current limiting circuit remains at or below the programmed current limit. Various examples of these systems and methods are now described with respect to FIGS. 1A-5.

Figure 1A:
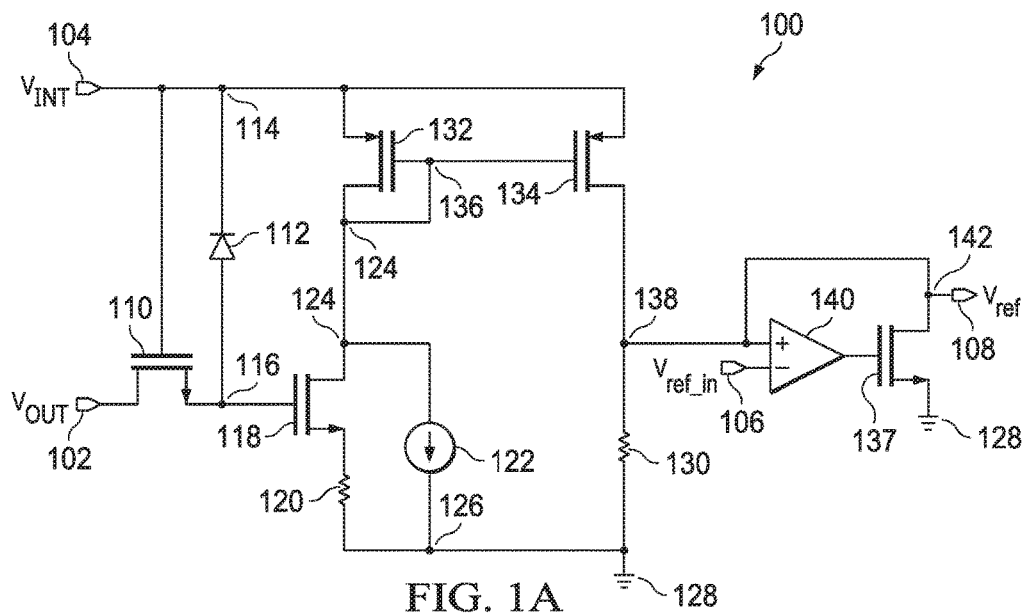
FIGS. 1A-1B depict circuit schematic diagrams of illustrative circuits in accordance with various examples.

FIG. 1A depicts a circuit schematic diagram of a circuit 100 in accordance with various examples. The circuit 100 may be implemented in any of a variety of current limiting circuits, examples of which are provided in FIGS. 3-4 and are described below. The circuit 100 is merely illustrative of circuits that may be used to control reference voltages relative to output voltages in current limiting circuits. In some examples, the circuit 100 includes an input terminal 102 to receive an output voltage of the current limiting circuit in which the circuit 100 is implemented. The circuit 100 further includes an input terminal 104 to receive a regulated voltage (provided by, e.g., any suitable power source), which acts as a power supply for the circuit 100. The circuit 100 comprises another input terminal 106, which receives a reference voltage that is equivalent to the voltage at numeral 210 in FIG. 2 (described below). Based on the voltage receives at terminals 102, 104, and 106, the circuit 100 outputs a reference voltage 108, which is used by the current limiting circuit in which the circuit 100 is implemented.

In some examples, the circuit 100 further comprises a transistor 110. The transistor 110, in some examples, is a field effect transistor (FET), such as an n-type metal oxide semiconductor FET (MOSFET). Other types of switches, such as bipolar junction transistors (BJTs) and gallium nitride (GaN) devices, also can be used, although the remainder of this description assumes the use of an n-type MOSFET. The transistor 110 has a drain that couples to the input terminal 102 and a gate that couples to input terminal 104 via node 114. The circuit 100 also comprises a diode 112. An anode of the diode 112 couples to the source of the transistor 110 via the node 116, and a cathode of the diode 112 couples to the node 114. The circuit 100 still further includes a transistor 118. As described above with respect to transistor 110, the transistor 118 may be any type of switch, but for purposes of this description, an n-type MOSFET is assumed. The gate of the transistor 118 couples to the node 116. A source of the transistor 118 couples to a resistor 120, which, in turn, couples to ground 128 via node 126, with nodes 114 and 126 serving as power supply rails for the circuit 100. A resistance of the resistor 120 may be selected as described below.

Figure 1B:
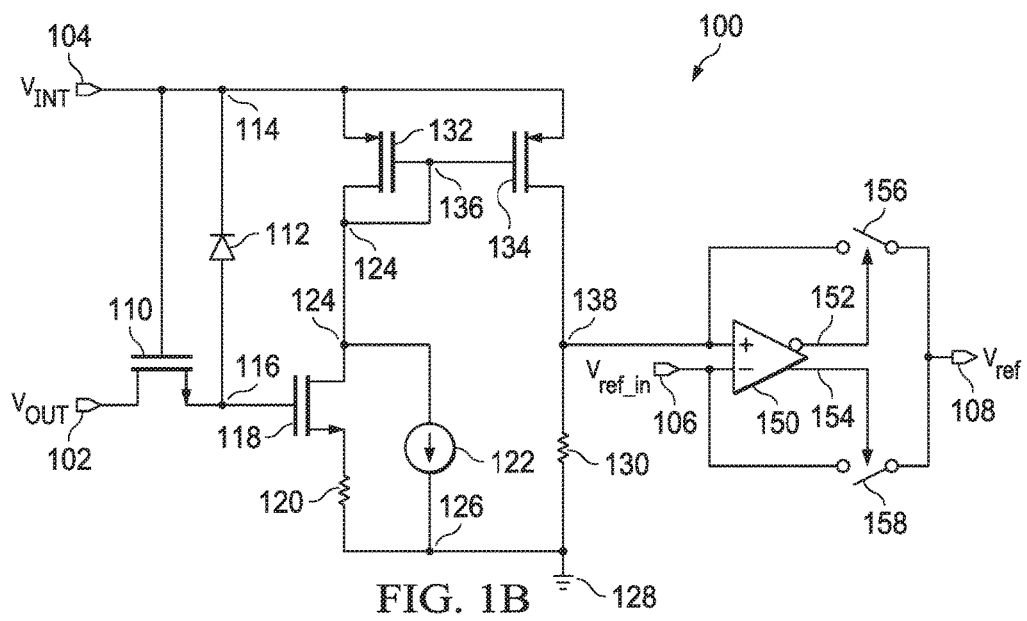

In some examples, the circuit 100 further comprises a bias current source 122, with the bias current output by the bias current source 122 selected as described below. The bias current source 122 couples to nodes 124 and 126. The circuit 100 also includes a current mirror having two transistors 132, 134, each of which can be any type of transistor but is depicted in FIG. 1A as being a p-type MOSFET. The source of the transistor 132 couples to the drain of the transistor 118 via node 124. The gates of the transistors 132, 134 are tied together at node 136, which is tied to node 124. The drains of the transistors 132, 134 couple to node 114. The source of the transistor 134 couples to node 138, which, in turn, couples to a resistor 130 (the resistance of which is selected as described below), which, in turn, couples to node 126. In some examples, the circuit 100 also comprises an amplifier 140, such as a negative feedback amplifier. An input (e.g., non-inverting input) of the amplifier 140 couples to node 138, and another input (e.g., inverting input) of the amplifier 140 couples to the input terminal 106. An output of the amplifier 140 is provided to a transistor 137 (e.g., n-type MOSFET) at its gate terminal. The source terminal of the transistor 137 couples to ground 128 and its drain couples to node 142. Node 142 couples to output terminal 108 and to node 138. In FIG. 1B, an alternative configuration is provided in lieu of the circuitry to the right of the node 138 in FIG. 1A. Specifically, in FIG. 1B, the node 138 and the input terminal 106 couple to the non-inverting and inverting inputs of the amplifier 150, respectively. The amplifier 150 has an inverting output 152 and a non-inverting output 154. The inverting output 152 controls a switch 156 and the non-inverting output 154 controls a switch 158. The switch 156 can connect and disconnect the node 138 from the output terminal 108, and the switch 158 can connect and disconnect the input terminal 106 from the output terminal 108.

As described below, the amplifier 140 (or amplifier 150) defines the conditions under which the circuit 100 is in a linear mode (i.e., linear region of operation) to control the reference voltage of the current limiting circuit (in which the circuit 100 is implemented) as a function of the output voltage of the current limiting circuit. When the circuit 100 is in a linear mode, the resistors 120, 130 define the ratio of the reference voltage (i.e., the voltage at output terminal 108) to the output voltage (i.e., the voltage at input terminal 102) for various values of the output voltage. Stated another way, when the circuit 100 is in linear mode, the resistors 120, 130 define the reference voltage (at output terminal 108) for any given output voltage (at input terminal 102). The resistors 120, 130 define this ratio of reference voltage to output voltage as:

$$\frac{\text{Resistance of resistor 130}}{\text{Resistance of resistor 120}} \quad (1)$$

Multiplying this ratio by the output voltage at input terminal 102 produces the reference voltage at output terminal 108.

Figure 2:
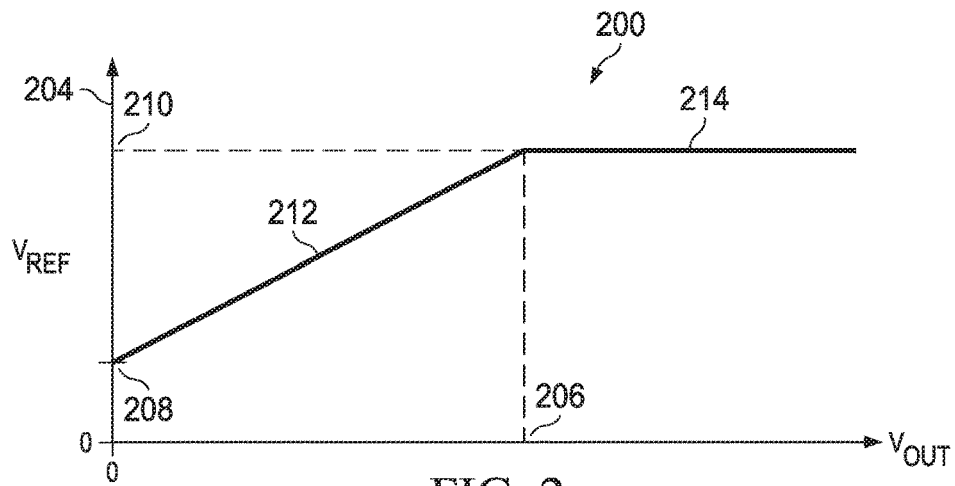
FIG. 2 depicts an output-voltage-to-reference-voltage graph in accordance with various examples.

Prior to describing the operation of FIGS. 1A-1B, brief reference is made to FIG. 2, which depicts an output-voltage-to-reference-voltage graph 200 in accordance with various examples. The graph 200 depicts the manner in which the circuit 100 controls the reference voltage of a current limiting circuit based on the output voltage. The graph 200 includes the output voltage on the x-axis 202 and the reference voltage on the y-axis 204. A curve 212 depicts the reference voltage as a function of output voltage for output voltages below a threshold 206. The threshold 206 is the point until which the circuit 100 is in a linear mode (for output voltages below the threshold). Above the threshold 206, the circuit 100 is not linearly controlling or actively modulating its output based on its input (for output voltages above the threshold). The curve 212 has a slope defined by the ratio in expression (1), above, and it has an intercept on the y-axis 204 at point 208. The point 208 defines the minimum value for the reference voltage when the output voltage is zero. Numeral 210 on the y-axis 204 defines the maximum reference voltage, which is reached when the circuit 100 is in inactive mode (i.e., the output voltage is at or above the voltage at threshold 206). The voltages at thresholds 206, 208, and 210 may be selected and programmed to achieve the desired parameters and performance from the circuit 100. One manner in which the voltage at threshold 206 may be selected is described further below.

Still referring to FIG. 2, the current limiting circuit errors described above may arise when the reference voltage is above the curves 212, 214 for any given value of the output voltage. Reference voltages under the curves 212, 214 are unlikely to result in the aforementioned instability. Thus, the resistances of resistors 120, 130 in the illustrative circuit 100 of FIG. 1A are chosen to result in a slope of curve 212 that will avoid instability in the current limiting circuit in which the circuit 100 is implemented. As implied above, the ratio of (1) does not define the curve 214 because the circuit 100 operates in inactive mode for output voltages above the voltage at threshold 206. In addition, the transistor 118 (FIGS. 1A-1B) is associated with a voltage drop, meaning that the voltage at input terminal 102 is not present across the resistor 120; rather, the voltage present across the resistor 120 is the voltage at input terminal 102 less the drop across transistor 118. Accordingly, the curves depicted in FIG. 2 are idealized curves that assume no drop across the transistor 118. In practice, because there is a drop across the transistor 118, the actual Vout-Vref curves are slightly lower than shown in FIG. 2. In any event, operating on a Vout-Vref curve below that shown in FIG. 2 (plus an accounting for the voltage drop across transistor 118) facilitates proper operation. In some examples, the drop across the transistor 118 is accounted for by including a level shifter at node 116.

Refer now simultaneously to FIGS. 1A, 1B, and 2. The regulated voltage provided at node 114 (e.g., by any suitable power source), minus the voltage drop across the transistor 110, results in a voltage at node 116. As the output voltage rises and exceeds the voltage at threshold 206 in graph 200, the transistor 110 prevents the voltage at node 116 from rising beyond the regulated voltage minus the voltage drop across the transistor 110. Even for relatively high output voltage values, the voltage at node 116 remains stable at the regulated voltage minus the gate-to-source voltage drop across the transistor 110. This voltage at node 116 defines a reference voltage at output terminal 108 which corresponds to the reference voltage of curve 214 in graph 200. Stated another way, when the voltage at node 116 stops rising even as the output voltage at input terminal 102 continues rising, the circuit 100 is operating in inactive mode. The diode 112 serves to discharge any current that may leak through the transistor 110 to node 116.

The voltage at the source of the transistor 118 is a voltage at the gate of the transistor 118 minus the voltage drop across the transistor 118. Stated another way, as the transistor 110 is on, the voltage at the source of transistor 118 is the output voltage at input terminal 102 minus the voltage drop across the transistor 118. Thus, the voltage at the source of transistor 118 is essentially the output voltage at input terminal 102 less the drop across the transistor 118 when the circuit 100 is in a linear mode. The current flowing through the transistor 118 is thus the output voltage, less the drop across the transistor 118, divided by the resistance of resistor 120. For purposes of this description, the drop across the transistor 118 is ignored because it is small relative to the voltage at the input terminal 10.

Setting aside for a moment the bias current source 122, the current flowing through resistor 120 is mirrored by the current mirror formed by the transistors 132, 134. The mirrored current flows through node 138 and through the resistor 130. The voltage at node 138 (across resistor 130) is thus given by the expression:

$$\frac{\text{(Output voltage at input terminal 102)} \times \text{(Resistance of resistor 130)}}{\text{Resistance of resistor 120}} \quad (2)$$

The voltage at node 138, given by expression (2), is provided to amplifier 140 (or amplifier 150) and produced as the final reference voltage output terminal 108.

In FIG. 1A, the amplifier 140 compares the voltage at the node 138 to the reference voltage at the input terminal 106 (which, as described, is in some examples equivalent to the voltage indicated by numeral 210 in FIG. 2). If the voltage at node 138 is lower than the reference voltage at the input terminal 106, the amplifier 140 keeps the transistor 137 off, meaning that the voltage at node 138 is the output at the output terminal 108. In this scenario, the circuit 100 is operating in linear mode. However, if the voltage at the node 138 exceeds the reference voltage at the input terminal 106, the amplifier 140 turns on the transistor 137 so that the transistor 137 sinks current from the node 138, thus reducing the voltage at node 138 to go below or to match the reference voltage at input terminal 106. In this scenario, the circuit 100 is operating in inactive mode.

In the alternative example of FIG. 1B, the amplifier 150 compares the voltages at 138 and 106. If the voltage at 138 is less than that at 106, the amplifier 150 outputs a high at 152, thus causing switch 156 to close, while switch 158 opens. This provides a connection between node 138 and the output terminal 108. In this scenario, the circuit 100 is operating in linear mode. However, if the voltage at 138 exceeds the voltage at 106, the amplifier 150 outputs a high at 154, thus causing the switch 158 to close, while switch 156 opens. This causes the reference voltage at input terminal 106 to be provided at the output terminal 108. In this scenario, the circuit 100 is operating in the inactive mode.

Still referring to FIGS. 1A-1B and 2, the ratio in expression (1) defines the slope of curve 212, and the expression (2) defines the reference voltage as a function of the output voltage for output voltages less than the voltage at threshold 206. The description up until this point, however, disregarded the bias current source 122. The bias current provided by the bias current source 122 defines the y-intercept at point 208 in graph 200. Specifically, the bias current from bias current source 122 provides a static offset for the reference voltage at output terminal 108. The bias current is added to the current flowing through the resistor 120. This combined current is mirrored and flows through the resistor 130, thus producing a reference voltage offset (i.e., y-intercept) that is given by:

$$\text{(Bias current)} \times \text{(resistance of resistor 130)} \quad (3)$$

This offset is added to the reference voltage given by (2) to produce the final reference voltage provided at the output terminal 108 and produces the linear region curve 212.

Figure 3:
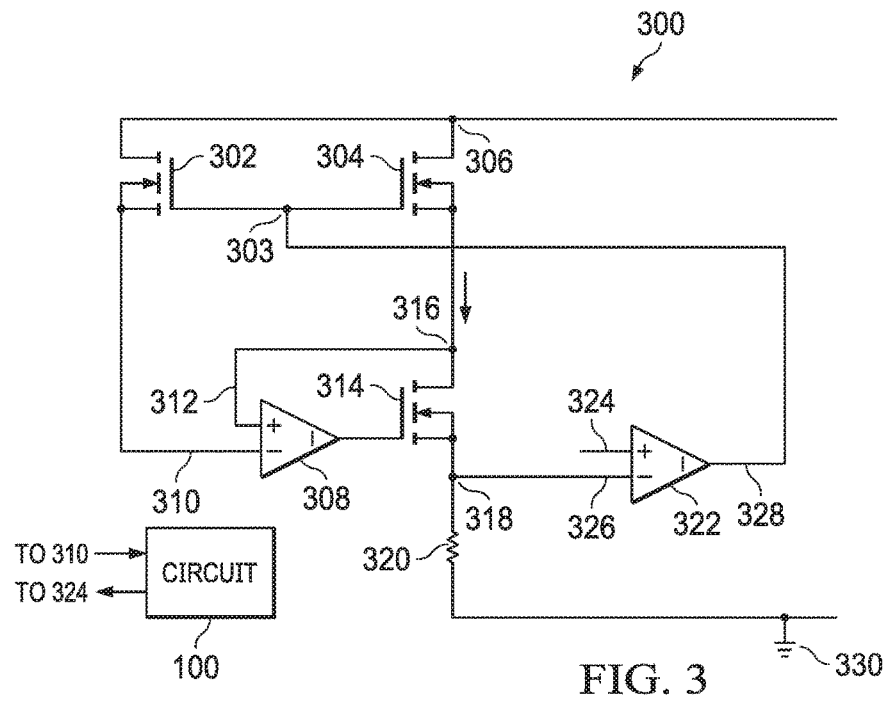
FIG. 3 depicts a circuit schematic diagram of another circuit in accordance with various examples.

In accordance with various examples, FIG. 3 depicts a circuit schematic diagram of an illustrative current limiting circuit 300 in which the illustrative circuit 100 may be implemented, or to which the illustrative circuit 100 may be coupled. The circuit 300 includes transistors 302, 304, and 314. These may be any suitable type(s) of transistors, although for purposes of description, n-type MOSFETs are assumed. The drains of the transistors 302, 304 couple to a power supply rail 306, and the gates of the transistors 302, 304 are tied together at node 303. The circuit 300 also includes an amplifier 308, with an output 310 coupled to a source of the transistor 302 and another input 312 coupled to a source of the transistor 304 at node 316. The output 310 carries the output voltage described with respect to FIGS. 1A-1B and 2.

The output of the amplifier 308 drives a gate of the transistor 314. A drain of the transistor 314 couples to the node 316, and a source of the transistor 314 couples to a node 318. An amplifier 322 has an input 326 coupled to the node 318 and another input 324 that receives a reference voltage (e.g., the reference voltage described with respect to FIGS. 1A-1B and 2). An output 328 of the amplifier 322 couples to the node 303. A resistor 320 couples to node 318 and may be part of the circuit 300 or may be external to the circuit 300. The resistor 320 couples to ground 330. In some examples, resistor 320 is external to the circuit 300.

In operation, the transistor 302 drives current out of its source terminal, and a tap coupled to the source terminal draws the current for use in another circuit or application. The circuit 300 regulates the flow of this current through the transistor 302 and the circuit 100 regulates its limit. The transistor 304 is a scaled-down version of the transistor 302 and, thus, may be termed a "sense" transistor 304. While the transistor 302 carries the primary or "main" current, the transistor 304 carries a proportionately reduced version of the main current, termed a "sense" current. The amplifier 308 couples to the sources of the transistors 302 and 304 and controls the transistor 314 to cause the voltage potentials at the sources of the transistors 302, 304 to be approximately the same. (The term "approximately," as used herein, means that one value is within plus or minus 15% of another value.) Because the gates of the transistors 302, 304 are tied together and the sources of these transistors are held to the same voltage potential, they are in the same states at the same times. The flow of current through the transistors 302, 304 is controlled by the amplifier 322. Specifically, the amplifier 322 controls the current flow through transistors 302, 304 in an attempt to bring the voltage across the resistor 320 (which is defined by the sense current through the resistor 320) to match the reference voltage provided at input 324. In this way, by regulating the sense current based on the reference voltage, the circuit 300 essentially regulates the main current through the transistor 302 using the reference voltage.

Without the benefit of the circuit 100, the circuit 300 may suffer from the errors described above when very low output voltage values are experienced. For example, if the output voltage at output 310 is zero or nearly zero (e.g., plus or minus 1 V), there is still some sense current flowing, and so the voltage at input 312 cannot match the zero (or nearly-zero) voltage at output 310. This can cause the sources of the transistors 302, 304 to be mismatched, and the K ratio between the two transistors may become skewed so that the effective value of K is much greater than the intended value of K (i.e., the current limit exceeds the programmed current limit). However, by connecting the input terminal 102 of the circuit 100 to the source terminal of the transistor 302, and by connecting the output terminal 108 of the circuit 100 to the input terminal 324 to the amplifier 322, the circuit 100 defines the reference voltage at input 324 based on the output voltage at the output 310 (source of transistor 302). The precise manner in which the circuit 100 controls the reference voltage based on the output voltage depends at least in part on the values of resistors 120, 130 and the bias current provided by the bias current source 122, as described above. By causing the relationship between the reference voltage and output voltage to be defined as shown in, e.g., the graph 200 of FIG. 2, the main current flowing through the transistor 302 is kept at or below the programmed current limit.

Figure 4:
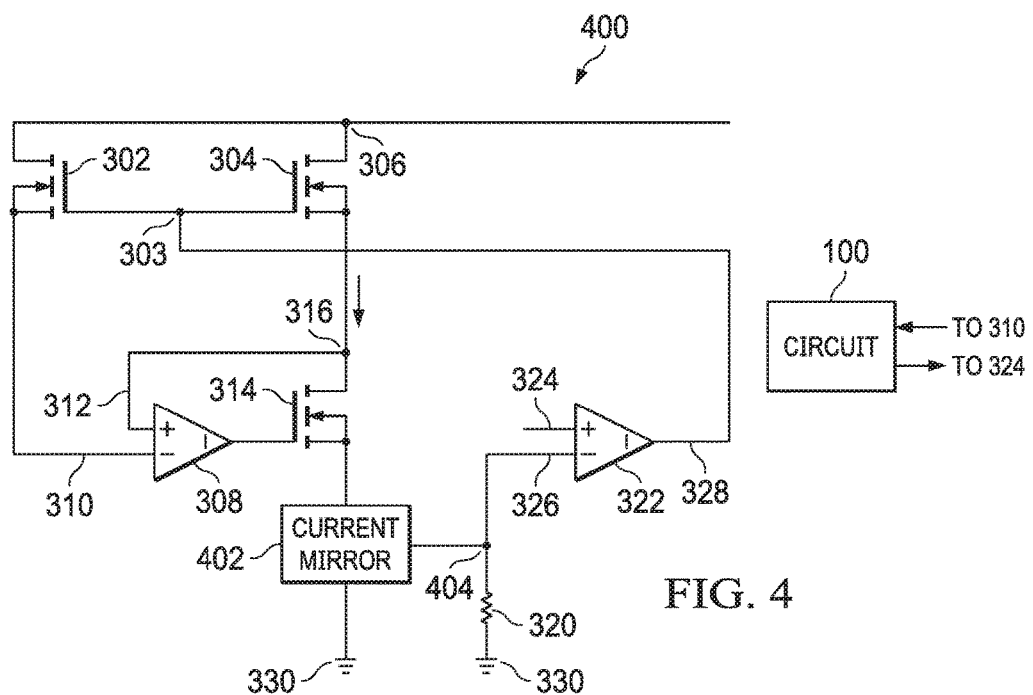
FIG. 4 depicts a circuit schematic diagram of still another circuit in accordance with various examples.

FIG. 4 depicts a circuit schematic diagram of another illustrative current limiting circuit 400 in accordance with various examples. The circuit 400 is similar to the circuit 300 but is more generic than circuit 300. The circuit 400 does not include node 318. Instead, circuit 400 includes a current mirror 402 (or, in some examples, a series of current mirrors) at the source of the transistor 314, which couples to ground 330 and to a node 404 (or, in the case of a series of mirrors, the coupling is to a regulated power supply). Node 404 couples to resistor 320, which couples to ground 330. The resistor 404 couples to input 326 of the amplifier 322. The circuit 400 operates similarly to the circuit 300, except that the sense current is mirrored to the node 404 and through the resistor 320 to ground 330. Such architectures also encounter the instability problems described above with the output voltage at the output 310 becomes too low. Accordingly, the circuit 100 is useful in architectures such as that of circuit 400 to maintain a main current through transistor 302 that is at or below the programmed current limit. In some examples where the circuit 100 is used in the context of a current limiting circuit such as circuit 400, the parameters of the circuit 400 are used to define the voltage at threshold 206 (FIG. 2). For example, the voltage at threshold 206 may depend on, or be the sum of, a full-scale voltage across the current mirror element 402, the voltage drop across the transistor 314 when the output voltage at output 310 is zero or nearly zero, and a margin voltage or offset voltage. The margin voltage is a "fail-safe" voltage that accounts for the process variations in the voltage drop across the series element (e.g., the resistor 320 in FIG. 3 or the current mirror 402 in FIG. 4) and the voltage drop across the transistor 314.

Figure 5:
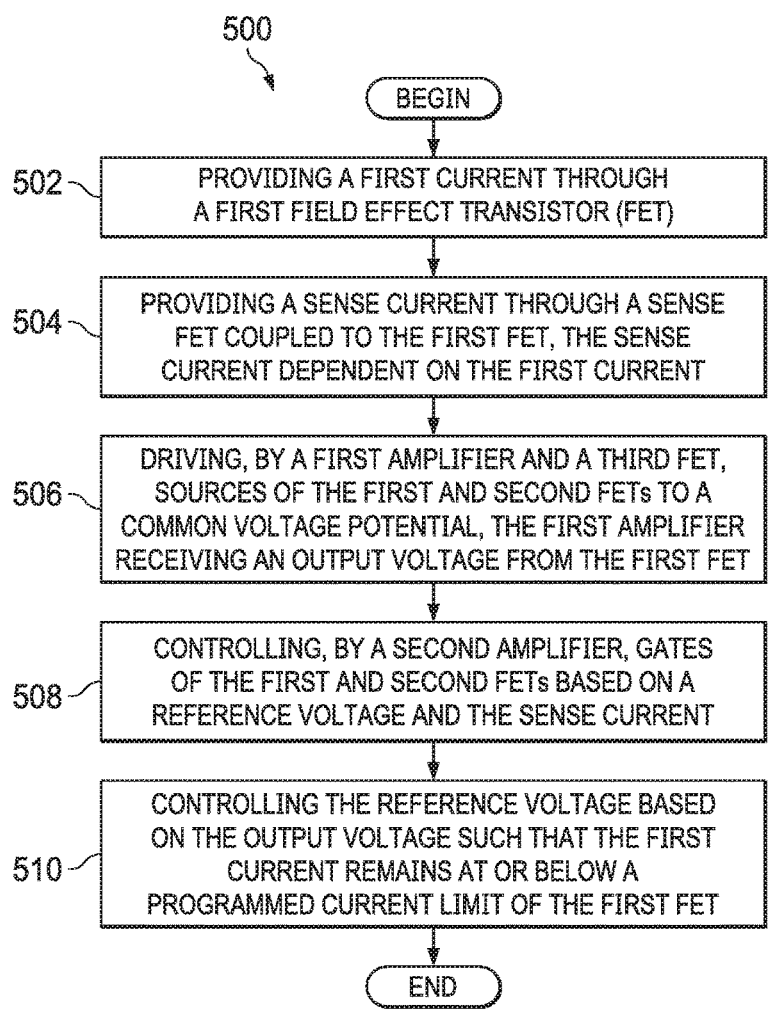
FIG. 5 depicts a flow diagram of an illustrative method in accordance with various examples.

FIG. 5 depicts a flow diagram of an illustrative method 500 in accordance with various examples. The method 500 comprises providing a first current through a first field effect transistor (FET) (step 502). The method 500 comprises providing a sense current through a sense FET coupled to the first FET, where the sense current is dependent on the first current (step 504). The method 500 includes driving, by a first amplifier and a third FET, sources of the first and second FETs to a common voltage potential, where the first amplifier receives an output voltage from the first FET (step 506). The method 500 further comprises controlling, by a second amplifier, gates of the first and second FETs based on a reference voltage and the sense current (step 508). The method 500 also includes controlling the reference voltage based on the output voltage such that the first current remains at or below a programmed current limit of the first FET (step 510). The method 500 may be modified as desired, including by adding, deleting, modifying, or rearranging one or more steps.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. A current limiting apparatus comprising:
a first transistor to carry a first current;
a sense transistor coupled to the first transistor, the sense transistor to carry a sense current that is a function of the first current;
a first amplifier coupled to the first transistor and the sense transistor, the amplifier to achieve a common voltage potential on terminals of the first and the sense transistors;

a second amplifier coupled to the first amplifier and the sense transistor, the second amplifier to control the first and sense transistors based on the sense current; and a circuit coupled to the first and second amplifiers, the circuit to control an input to the second amplifier based on an input to the first amplifier such that a current limit of the first transistor remains below a programmed current limit of the first transistor, wherein the circuit comprises a third transistor to receive a regulated voltage and the input to the first amplifier, and wherein the circuit further comprises a fourth transistor that couples to the third transistor.

2. The apparatus of claim 1, wherein the input to the first amplifier couples to a terminal of the first transistor to carry the first current.

3. The apparatus of claim 1, wherein the circuit further includes a resistor coupled to a terminal of the fourth transistor.

4. The apparatus of claim 3, wherein the circuit further comprises a bias current source coupled to a different terminal of the fourth transistor.

5. The apparatus of claim 3, wherein the circuit further comprises a current mirror coupled to a different terminal of the fourth transistor.

6. The apparatus of claim 5, wherein the circuit further includes another resistor coupled to the current mirror and an amplifier coupled to the resistor.

7. The apparatus of claim 6, wherein the circuit comprises a fifth transistor having a gate terminal coupled to an output of the amplifier, a source terminal coupled to ground, and a drain terminal coupled to the another resistor.

8. The apparatus of claim 6, wherein the amplifier controls a first switch able to connect the another resistor to an output terminal of the circuit and controls a second switch able to provide a reference voltage provided to the amplifier to the output terminal of the circuit.

9. The apparatus of claim 3, wherein the circuit includes a pair of resistors, and wherein the circuit is to control the input to the second amplifier based on the input to the first amplifier and a ratio of resistances of the pair of resistors.

10. An apparatus comprising:
a current-limiting circuit to receive an output voltage and a reference voltage; and
a circuit coupled to the current-limiting circuit and configured to control the reference voltage based on the output voltage, the circuit comprising:
a first field effect transistor (FET) having a drain to receive the output voltage and a gate to receive a regulated voltage;
a second FET having a gate coupled to a source of the first FET, the second FET further including a source coupled to a first resistor and a drain coupled to a current mirror;
a second resistor coupled to the current mirror; and
an amplifier coupled to the second resistor and to the current mirror,
wherein the first and second resistors define a ratio of the reference voltage to the output voltage.

11. The apparatus of claim 10, further comprising a bias current source coupled to the drain of the second FET and to the current mirror.

12. The apparatus of claim 11, wherein a bias current produced by the bias current source defines a minimum value of the reference voltage.

13. The apparatus of claim 10 further comprising a diode, an anode of the diode coupled to the source of the first FET and to the gate of the second FET, and a cathode of the diode to receive the regulated voltage.

14. The apparatus of claim 10, wherein the current-limiting circuit comprises:
a third FET and a fourth FET having gates and drains tied together; and
a second amplifier having a first input coupled to a source of the third FET and a second input coupled to a source of the fourth FET, the first input to receive the output voltage.

15. The apparatus of claim 14, wherein the current-limiting circuit further comprises:
a fifth FET coupled to the source of the fourth FET and to the second input of the second amplifier, the fifth FET having a gate coupled to an output of the second amplifier; and
a third amplifier coupled to the fifth FET and to receive the reference voltage, an output of the third amplifier coupled to the gates of the third and fourth FETs.

16. A method comprising:
providing a first current through a first field effect transistor (FET);
providing a sense current through a second FET coupled to the first FET, the sense current dependent on the first current;
driving, by a first amplifier and a third FET, sources of the first and second FETs to a common voltage potential, the first amplifier receiving an output voltage from the first FET;
controlling, by a second amplifier, gates of the first and second FETs based on a reference voltage and the sense current;
controlling the reference voltage based on the output voltage such that the first current remains at or below a programmed current limit of the first FET;
discontinuing controlling the reference voltage based on the output voltage when the output voltage exceeds a threshold; and
selecting the threshold based on another reference voltage and a voltage drop across the third FET when the output voltage is zero.

17. The method of claim 16 further comprising:
discontinuing controlling the reference voltage based on the output voltage when the output voltage exceeds a threshold; and
selecting the threshold based on another reference voltage and a voltage drop across the third FET when the output voltage is zero.

18. The method of claim 16, further comprising using a bias current source to set a minimum value of the reference voltage.

19. The method of claim 16, wherein controlling the reference voltage based on the output voltage comprises using a circuit that includes:
a fourth field effect transistor (FET) having a drain to receive the output voltage and a gate to receive a regulated voltage;
a fifth FET having a gate coupled to a source of the fourth FET, the fifth FET further including a source coupled to a first resistor and a drain coupled to a current mirror;
a second resistor coupled to the current mirror; and
a third amplifier coupled to the second resistor and to the current mirror,
wherein the first and second resistors define a ratio of the reference voltage to the output voltage.

* * * * *